United States Patent [19]

Zbinden

[11] Patent Number: 4,567,428

[45] Date of Patent: Jan. 28, 1986

[54] DETECTION OF CATASTROPHIC FAILURE OF DIELECTRIC, IMPROPER CONNECTION, AND TEMPERATURE OF A PRINTED CIRCUIT ASSEMBLY VIA ONE WIRE

[75] Inventor: Terry B. Zbinden, Maple Grove, Minn.

[73] Assignee: Sperry Corporation, New York, N.Y.

[21] Appl. No.: 675,050

[22] Filed: Nov. 26, 1984

Related U.S. Application Data

[62] Division of Ser. No. 395,511, Jul. 6, 1982, Pat. No. 4,504,782.

[51] Int. Cl.$^4$ .................. H05K 1/00; G01R 15/12
[52] U.S. Cl. .................. 324/73 PC; 324/54; 174/68.5
[58] Field of Search .............. 174/68.5, 11 R; 338/26; 324/73 PC, 54; 340/870.11, 517

[56] References Cited

U.S. PATENT DOCUMENTS

| | | | |
|---|---|---|---|
| 2,587,916 | 3/1952 | Squier | 338/26 |
| 2,842,648 | 7/1958 | Reynolds | 338/26 |
| 3,760,319 | 9/1973 | Kawazoe | 338/26 |
| 3,769,578 | 10/1973 | Stalgy | |
| 3,792,458 | 2/1974 | Smith | |
| 4,090,194 | 5/1978 | Kosuge | 340/517 |

OTHER PUBLICATIONS

Bozzey: "Insulation Testing . . . ", IBM Tech. Discl. Bulletin, vol. 24, No. 8, Jan. 1982, pp. 4202-4203.

Primary Examiner—Stanley T. Krawczewicz
Assistant Examiner—Jose M. Solis
Attorney, Agent, or Firm—William C. Fuess; Glenn W. Bowen

[57] ABSTRACT

A first sensor for the detection of dielectric failure (by burning) within a multilayer printed circuit assembly comprises an isolated conductive layer. This first sensor is connected by a first diode to a single wire which also connects a second, temperature, sensor via a second diode (system ground is a return). A multiplicity, nominally 16, of such single wire connected sensor pairs are selectable in accordance with an externally (microprocessor) furnished address. During a first time period, an externally (microprocessor) selected interrogation of temperature causes a first, positive, voltage bias to be applied to the selected sensor pair resulting in a current linear with temperature (over the range of 0° C. to 100° C.) in the second sensor. This current is transformed to voltage, offset by 273° Kelvin, amplified, and converted to a digital value for issuance to an external (microprocessor) requestor. During a second time period, an externally (microprocessor) selected interrogation of dielectric failure causes a second, negative, voltage bias to be applied to the selected sensor pair. Any current sensed—which represents failure shorts between the isolated conductive layer and any other voltage, ground, or signal within the multilayer printed circuit assembly—is transformed to voltage, amplified, digitalized and issued externally. If neither temperature nor dielectric leakage currents can be properly sensed, and especially for plural addressable sensor pairs upon the same printed circuit assembly, then the assembly is deemed to be unconnected or improperly pluggably connected. Temperature (over temperature), dielectric failure, and failed connection are cyclically continuously monitored for a multiplicity of sensor pairs upon a plurality of printed circuit assemblies with an individual sensor test, or interrogation, time of 50 milliseconds.

5 Claims, 3 Drawing Figures

DETECTION OF CATASTROPHIC FAILURE OF DIELECTRIC, IMPROPER CONNECTION, AND TEMPERATURE OF A PRINTED CIRCUIT ASSEMBLY VIA ONE WIRE

This is a divisional of application Ser. No. 395,511 filed July 6, 1982, now U.S. Pat. No. 4,504,782.

BACKGROUND OF THE INVENTION

The present invention relates generally to fault condition monitoring of printed circuit assemblies, such as those utilized within a digital computer, and specifically to the detection of the catastrophic failure of the dielectric in a multilayer printed circuit assembly, to the detection of the improper pluggable connection or non-connection of such as printed circuit assembly, and to the detection of temperature (over temperature) occurring on such printed circuit assembly. All such detections occur via a single signal wire, using system ground as the return.

Modern digital computers often use an array of multilayer printed circuit boards or assemblies to hold the digital logic components, interconnect them, and provide power to them. The amount of power used in such arrays of printed circuit assemblies is very high, on the order of tens of kilowatts. If a breakdown in the printed circuit dielectric between voltage and ground occurs, sufficient power is available to cause burning (carbonization) and potential fire on the failed printed circuit assembly. Such a catastrophic failure and fire may damage other closely spaced printed circuit assemblies.

The prior art burn detection method of smoke, or combustion product, detectors suffer from unreliability and a slow response time relative to the speed of the burn. Also previously utilized, overcurrent detection in power supplies is now insufficient to protect an individual printed circuit assembly. This is because the power supply may be outputting sufficient current to allow the catastrophic burn of an individual multilayer printed circuit assembly without such sufficient excess, or over, current as may be detected and utilized to protect such assembly. Finally, it would be possible to fuse each individual printed circuit assembly but such fusing is often inefficient or impractical. Fuses have a voltage drop and interfere with regulation of the d.c. voltage source. Fuses are physically large for the currents involved, approximately 100 amperes, and do not fit on a printed circuit board. Finally, if an individual printed circuit card assembly is fused at full circuit current, a burn may still occur and not blow the fuse.

As second and third aspects of the present invention the detection of an improper connection of a pluggable printed circuit assembly, and the temperature condition, including over temperature, occurring upon such printed circuit assembly will be detected upon a single signal wire, such single wire as is additionally utilized for the detection of catastrophic failure of the dielectric of the multilayer printed circuit assembly. Improper connection of a pluggable printed circuit assembly means that the connector(s) of such assembly, such as a linear plug, is (are) not physically correctly inserted to allow contacting the proper pins, or printed circuit lands, upon the printed circuit assembly. To the maximum extent possible, such improper plug connection of a printed circuit assembly is normally precluded by a physical design of the connectors so that improper mating is precluded. Insofar as electrical methods detect and verify the proper connection of a pluggable assembly, a check of the continuity through a first end pin of the connector, across a proscribed path upon the printed circuit assembly, and out an opposite end pin of the connector might be performed in order to demonstrate that the printed circuit assembly was properly plugged at least at each end of the connector. If one connected pin, possibly an end pin, is ground, then the proper occurrence of ground, as routed by the printed circuit assembly, upon another pin, possibly the other end pin, may be observed as an indication of correct connection. Finally, some signal(s) developable upon the printed circuit assembly only in the event of proper connection may be observed as an index (indices) of such proper connection. Should such electrical checks for proper connection be performed at all, they would not usually be perceived as being associated with either the sensing of temperature (detection of over temperature) nor the detection of the catastrophic failure of a dielectric in a multilayer printed circuit assembly.

Finally, the sensing of temperature (detection of over temperature) occurring upon a multilayer printed circuit assembly by the interrogation of a sensor, such as a thermocouple or thermistor, located upon such multilayer printed circuit assembly is old in the art. Normally, one port of a two port sensor is connected to either voltage or ground and only the signal resultant at the other port needs be routed from a pluggable multilayer printed circuit assembly for the external sensing of temperature occurring upon such assembly. When such a single wire connection is utilized for the sensing of temperature upon a printed circuit assembly, it is not normally associated with any additional purpose(s).

SUMMARY OF THE INVENTION

The present invention allows the detection of the catastrophic failure of the dielectric within a multilayer printed circuit assembly. Such detection requires one wire, or connector contact, with ground as the return path. Upon this same wire the improper connection, or non-connection, of the printed circuit assembly as pluggably connected (non-connected) to a multi-position connector may additionally be sensed. Finally, a sensor detecting temperature and over temperature upon the multilayer printed circuit assembly may additionally be sensed through the same wire interconnect.

The preferred embodiment detection of the catastrophic failure of the dielectric in a multilayer printed circuit assembly involves the three elements of (1) an isolated conductive plane connected via a (2) diode to a (3) voltage biasing (in a first direction) and sensing means. The isolated conductive plane, normally copper, is employed throughout the area of each logic board, side panel, and back panel multilayer printed circuit assembly which is subject to test for failure of the dielectric. This isolated conductive plane, or sensor layer, will normally "float" with more than one megohm of resistance to any other voltage, ground, or signal in the protected logic boards. This separate layer may be monitored directly, without voltage biasing or diode isolation means, for showing low resistance to any other part of the multilayer printed circuit assembly circuitry, thereby indicating a failure breakdown of the dielectric, responsively to which dielectric breakdown power is normally turned off to preclude further charring and potential fire. If, however, the detection of low resistance shorts between this isolated sensor reference layer and any other voltage, ground or signal within the multilayer printed circuit assembly is desired to be combined, for efficiency of pin and wire utilization, with additional functions (of additional sensors) such as proper connection and temperature, then this isolated reference sensor layer is normally connected to a voltage bias and sense means through an isolation diode. Such voltage biasing means will forward bias the connective diode in order to sense for low resistance shorts to the reference sensor layer. The diode stops the reference sensor layer's normal leakage from affecting any other utilization of the same sense wire when the isolation diode is back-biased.

When such diode isolation of a reference sensor layer for the detection of dielectric failure in a multilayer printed circuit assembly is employed, then a diode isolated temperature sensor may be employed upon the same wire connection. The voltage biasing and sensing means connected to this wire will at one time provide a first bias voltage for forward biasing the diode connecting to the sensor reference layer in order to allow first sensing for low resistance failure shorts to such layer. The voltage biasing and sensing means will at a second time provide a second, reverse, voltage bias which will forward bias the diode connecting to the temperature sensor and permit the second sensing of the output of such temperature sensor. During the period of first voltage biasing (for sensing of current to the sensor reference layer for the detection of the catastrophic failure of the dielectric), the diode isolating the temperature sensor will be back-biased and thusly the temperature sensor will draw no current and will not interfere with such first sensing. During the second period voltage biasing (for checking of the temperature sensor), the diode isolating the reference sensor layer will be back-biased, and thusly the reference sensor layer will draw no current and will not interfere with such second sensing. Thusly, by utilizing at a first time a first voltage region for the sensing of the catastrophic failure of a dielectric in a multilayer printed circuit assembly, and by utilizing at a second time a second voltage region for the sensing of the temperature upon such printed circuit assembly, a common wire connection may be utilized for both purposes.

The same voltage biasing and sensing means which in a first voltage bias region senses that low resistance which indicates dielectric failure, and which in a second voltage bias region senses that resistance which indicates temperature, can, through such sensing, support the determination that the subject printed circuit assembly is improperly connected, or not connected at all, if neither current can be sensed as anything abnormal. Thusly, a single voltage biasing and sensing means which first voltage biases to a first voltage region in order to sense the resistance of a sensor reference layer, and second voltage biases to a second voltage region in order to sense the resistance of a temperature sensor, provides respective dielectric breakdown and temperature information, which if considered jointly, is also indicative of the correct printed circuit assembly pluggable connection. By such a combinatorial utilization of obtained observations, it is more effective (as well as more efficient in wires, connector pins, and voltage biasing and sensor circuits employed) to exercise the functions of detection of the catastrophic failure of dielectric, improper connection, and over temperature of a printed circuit assembly jointly collectively via one wire than to perform such sensings separately.

Correspondingly, it is a first object of the present invention that a multilayer printed circuit assembly will be checked for the occurrence of the failure of the dielectric and/or a catastrophic burn wherein shorts develop between the printed circuit lands which carry voltages and those lands as variously carry signals and ground. It is a second object of the present invention that the monitoring of temperature upon a printed circuit assembly will be accomplished in a time-multiplexed fashion across the same single wire which is elsetimes utilized for the detection of a dielectric failure upon such printed circuit assembly. It is a third objective of the present invention that the non-connection, or improper pluggable connection, of a printed circuit assembly may be determined by the responses received upon that same single wire which is utilized for either the detection of dielectric failure and/or the monitoring of temperature upon such printed circuit assembly.

It is a fourth objective of the present invention that the sensing of dielectric breakdown and/or temperature and/or improper connection of a printed circuit assembly (whether jointly sensed in a time-multiplexed manner via a single wire or not) as detected by a multiplicity of sensors upon a plurality of printed circuit assemblies should be accomplished in a selectable addressable fashion. Such selectable addressing and interrogation of each of a multiplicity of sensors, normally continuously accomplished in cyclic rotation for the detection of incipient fault conditions, is enabled responsively to an address supplied from an external microprocessor.

DESCRIPTION OF THE PREFERRED EMBODIMENT

Figures 1, 1A:
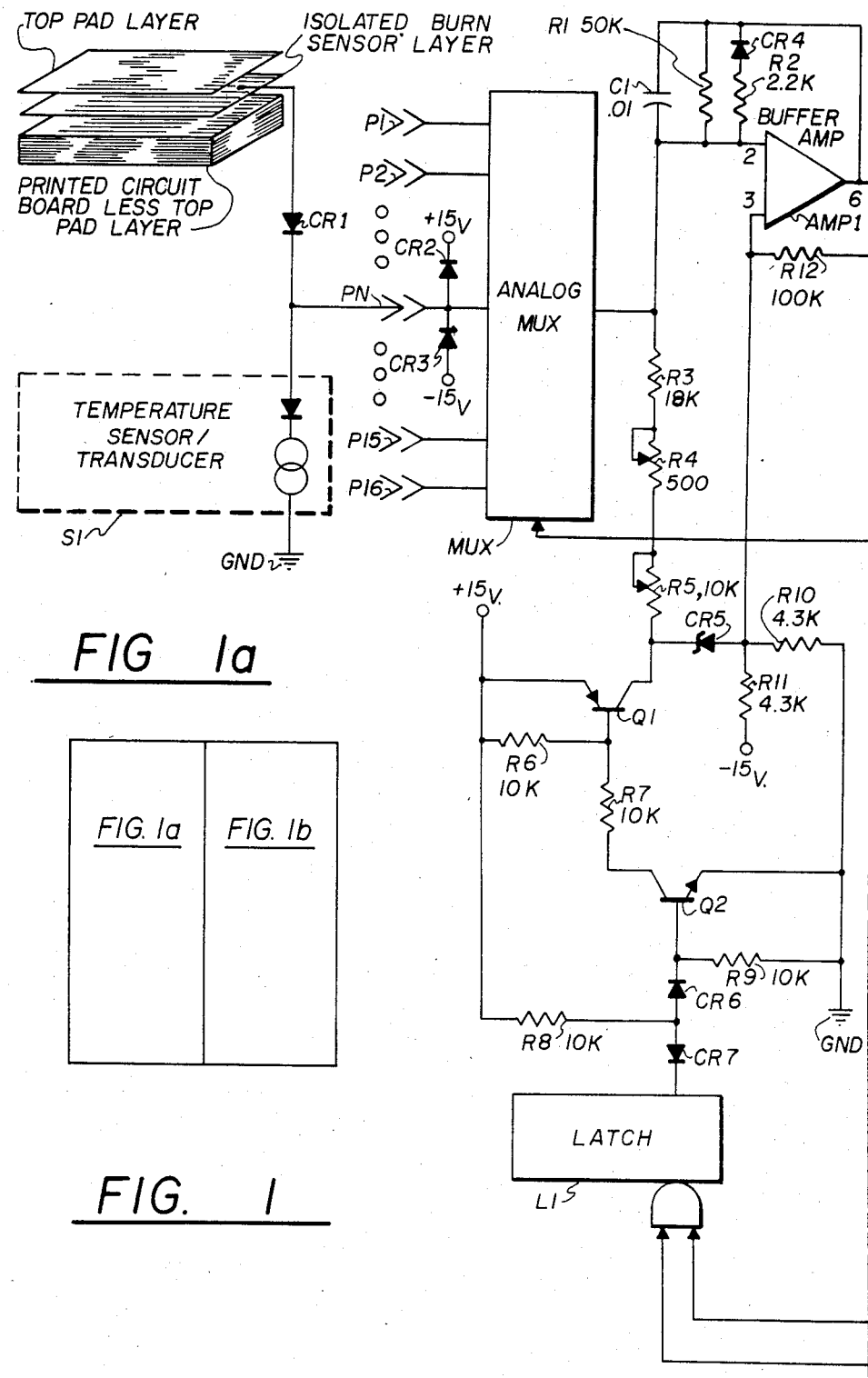
FIG. 1, consisting of FIG. 1a and FIG. 1b, shows the apparatus of the present invention consisting of a diagrammatically illustrated dielectric failure sensor and a schematically represented temperature sensor/transducer which are jointly commonly connected to a schematically represented electronic circuit such as allows the detection of the catastrophic failure of the dielectric, the improper connection, and/or the temperature (over temperature) of the printed circuit assembly.
Figure 1B:
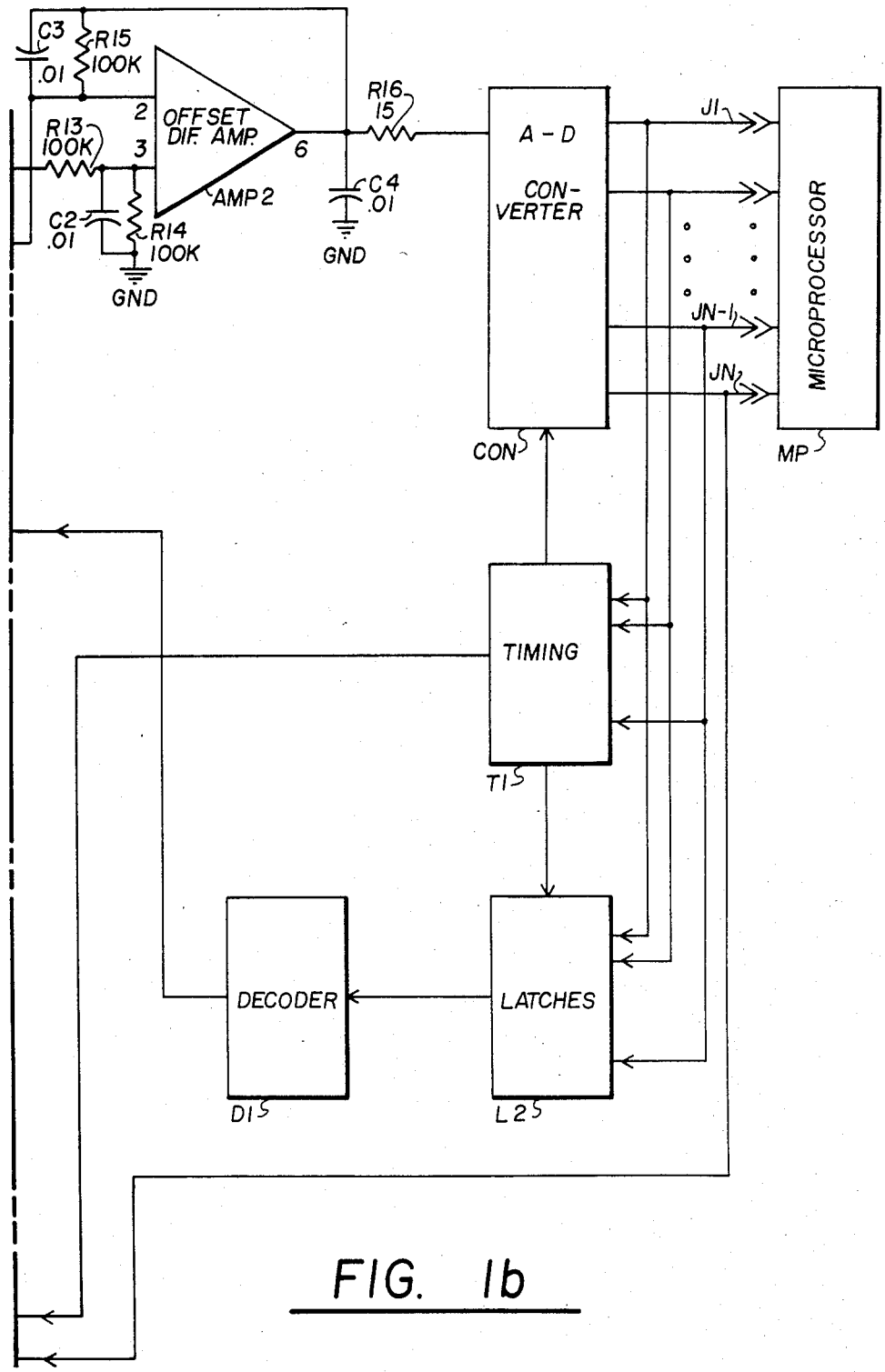

In the past, air cooled computers sensed printed circuit assembly high assembly temperature and high air temperature faults via the use of mechanical thermostats. These mechanical thermostatic switches were mounted in the main airstream as it left the modules being monitored, or upon the modules themselves. Because of the mixing effect of the airstream above the printed circuit assemblies, a few distributed sensors could provide adequate protection. Previously utilized mechanical thermostats are very slow acting in air with a time constant of several minutes and a nominal accuracy of ±3° C. More exacting monitoring and protection of individual printed circuit asemblies was not previously considered necessary or practical. The more exacting temperature monitoring and high over temperature fault detection scheme of the present invention utilizes an electronic temperature transducer, such as may be commercially purchased as type AD 590J available from Analog Devices, Inc., or such as is taught within U.S. patent application Ser. No. 395,516 entitled COOLING SYSTEM ASSEMBLY AND METHOD to T. P. Currie and T. B. Zbinden. The preferred embodiment temperature transducer is implemented in die form, and is mounted in a standard size single scale . integrated circuit package upon the printed circuit assembly. The physical dimension of the die cavity of the temperature sensor/transducer taught in U.S. patent application Ser. No. 395,516 is approximately 0.34 centimeters by 0.34 centimeters (0.135 inches by 0.135 inches). The temperature sensor/transducer is a linear output integrated circuit current type device which sinks one microampere per degree Kelvin. The use of current type devices eliminates the effect of ground loss. A single signal contact per printed circuit assembly is needed to transmit, as a current signal, the temperature of the printed circuit assembly to further circuitry of the present invention, called a scan circuit, which may be remotely situated upon a separate card. The temperature sensor/transducer of the preferred embodiment of the invention, such as is intended to be utilized in a liquid coolant cooled computer, is calibrated and sensed for the determination of temperature over the range of approximately 0° C. to 100° C., although the application of the principles of the present invention to other temperature sense ranges is possible.

Also in the past, fire detection in multilayer printed circuit assemblies had been done with smoke detectors which were unreliable, or with the detection of over current within power supplies. Modern digital computers often utilize an array of multilayer printed circuit assemblies to hold the circuit components, interconnect them, and provide power to them at high densities and close conductor spacings. The mount of power utilized in such new arrays of multilayer printed circuit assemblies is very high, and it has been found that if a breakdown in the dielectric between a voltage and ground occurs, sufficient power is available to cause the catastrophic dielectric breakdown and a potential fire upon the failing multilayer printed circuit assembly. Individual circuit fusing of the multilayer printed circuit assemblies is not feasible, so the apparatus of the present invention provides a means of detecting this dielectric failure and ensuing burn before it can cause severe damage to other circuit assemblies, property and personnel. The method of the present invention utilizes a separate, isolated, conductive layer, such as of copper, inside the multilayer structure of the multilayer printed circuit assembly. When this normally isolated separate burn sensor layer shows a low resistance to any other parts of the multilayer printed circuit assembly, indicating a breakdown of the dielectric, a failure has been found and the power can be turned off prior to the development of a further, catastrophic, burn.

Two separable and severable systems concepts are applied in the utilization of the circuit of the present invention for the interrogation and interpretation of the temperature sensor/transducer and the burn detection sensor layer (as may each be located upon a single multilayer printed circuit assembly). These separable and several system concepts are, however, most efficacious for the further detection of the improprer pluggable connection of such a printed circuit card assembly when such systems concepts are both implemented. The first system-type concept of the circuit of the present invention is that both the temperature sensor/transducer (such as indicates the temperature occurring upon a printed circuit assembly) and the isolated burn sensor layer (such as indicates the occurrence of a dielectric breakdown within a multilayer printed circuit assembly) may be interrogated in a time-multiplexed fashion via a single wire. This is accomplished by a circuit, the previously identified scan circuit, which provides a voltage bias (nominally positive) during a first time period via the single wire connection (with ground as the return path) for the sensing of the temperature sensor/transducer upon the printed circuit assembly, and which first derives the temperature therefrom such sensing. During a second time period a complementary voltage bias (nominally negative) will be provided by the scan card circuit via the same single wire to the multilayer printed circuit assembly for the pupose of detecting low resistance shorts between the isolated burn sensor layer and any other voltage, ground, or signal within the multilayer printed circuit assembly. The temperature sensor/transducer and the isolated burn sensor layer are each isolated by an associated diod. During the application of the first voltage bias (nominally positive) the diode isolating the burn sensor layer is reverse biased whereas the diode isolating the temperature sensor/transducer sensor element is forward biased. Thereby the current resultant from the temperature sensor/transducer sensor element will be sensed while any current leakage, whether normal or abnormal, in the isolated burn sensor layer will be blocked by the reverse biased diode from affecting such temperature sensing. Conversely, when the second voltage bias (nominally negative) is applied, the diode isolating the burn sensor layer is forward biased whereas the diode isolating the temperature sensor/transducer sensor element is reverse biased. In such a second bias condition, no current will flow in the temperature sensor/transducer sensing element and the only current sensed will be that occurring between the isolated burn sensor layer and other voltages, grounds, or signals within the multilayer printed circuit assembly. Thus, the first systems concept applied is that the detection of the catastrophic failure of the dielectric and the temperature (over temperature) of a multilayer printed circuit assembly may be accomplished in a time-multiplexed manner via a single wire.

It is separable and severable second systems concepts in the circuit of the present invention that the sensing of dielectrick breakdown and temperature (whether jointly sensed in a time-multiplexed manner via a single wire in accordance with the first systems concept or not) upon a plurality of printed circuit assemblies should be accomplished in a selectable addressable rotation. Such rotational addressable sensing of a multiplicity of dielectric failure and temperature type sensors is accomplished by the scan circuit of the present invention responsively to addresses supplied from an external microprocessor. The scan circuit of the present invention, so-named because it allows the multiplicity of sensors upon the plurality of printed circuit assemblies to be addressably interrogated or scanned, looks like a memory to such microprocessor wherein each sensor is an address.

Such a second systems concept, especially in conjunction with the first systems concept of time-multiplexed sensing of dielectric failure and temperature, allows the detection of improperly inserted and connected printed circuit assemblies. If for all addresses sent to the scan circuit by the microprocessor no response is received, then the scan circuit itself has failed. If the first systems concept is employed, thereby sensing dielectric failure and temperature via a single wire at a single address, and a response to both such sensings equivalent to an improper reading is detected then the strong implication is that the selected printed circuit assembly is improperly electrically connected. This conclusion is especially strong if two such addresses (as are connected by two wires) communicate to two dielectric failure and temperature sensor circuits upon the same printed circuit assembly such as can transpire when the second systems concept is employed. It is exceedingly unlikely that an identical sensing, equivalent to an improper reading should be sensed at the two addresses corresponding to the two such sensors. The employment of both systems concepts within the preferred embodiment of the present invention permits of the unambiguous electrical determination that a printed circuit assembly is absent or improperly connected. Such a determination is normally used by a power control system (not part of the present invention) to remove power from that pluggable location at which a printed circuit assembly is either absent or improperly connected.

The diagrammatic and schematic representation of the present invention is shown within FIG. 1. The physical structure of the multilayer printed circuit assembly subjectable to dielectric failure testing is diagrammatically represented as TOP PAD LAYER, ISOLATED BURN SENSOR LAYER and PRINTED CIRCUIT BOARD LESS TOP PAD LAYER. Such a multilayer printed circuit assembly need not be structured identically in the three parts as illustrated, the sole requirement being that an electrically conductive layer isolated from all other signals, voltages, and grounds upon the multilayer printed circuit assembly be established. The diode connection to the isolated burn sensor layer via diode CR1 type 1N4150 needs be accomplished only if the temperature sensor/transducer assembly S1 is jointly connected via a single wire (connected through plug jack PN to the analog multiplexor MUX which commences the scan circuit). The temperature sensor/transducer assembly S1, which is old in the art, is part number AD590J available from Analog Devices, Inc. This temperature sensor/transducer S1 sinks an essentially linear one microampere per degree Kelvin to ground GND when biased within the range of +4.5 to +30 volts d.c. The temperature sensor/transducer assembly S1 contains an integral diode as illustrated, and is mounted as a die contained within a normal integrated circuit package upon the printed circuit assembly.

The remaining circuitry as is shown in FIG. 1 accomplishes the dual system's purposes of allowing the time-multiplexed sensing of dielectric failure and temperature upon a single wire, and the addressable selection amongst a multiplicity of such wires. The analog multiplexor MUX, the latches L2, and the decoder D1 are primarily involved with the second system's purpose of allowing selection amongst a multiplicity of sensors. These circuit elements could be eliminated from the scan circuit of the present invention, with a single analog sensor signal as appears at plug jack PN being directly passed for amplification in buffer amplifier AMP1, offset amplification in offset differential amplifier AMP2, and conversion to a digital signal in analog to digital converter CON.

That portion of the scan circuit as shown in FIG. 1 concerned with the implementation of the first systems purpose of time-multiplexed sensing of both dielectric failure and temperature via a single wire resides in the area of latch L1 through resistor R3, including transistors Q1 and Q2. This portion of the scan circuit will, under the selection control of a digital signal received from an external microprocessor MP and as gated by timing T1, apply at a first time a first positive voltage bias and apply at a second time a second negative voltage bias to the dielectric failure sensors and the temperature sensor/transducer S1 as are jointly connected through plug jack PN. The preferred embodiment implementation of the invention as shown in FIG. 1 can be altered by the elimination of either that portion of the apparatus as serves the first system's purpose or the second system's purpose. For example, if addressable selection, such as is ultimately enabled under control of external microprocessor MP, is deleted then the remaining circuit shown is still operative for the combinatorial sensing of dielectric failure and temperature via a single wire. Alternatively, if temperature sensor/transducer S1 (which is old in the art) were deleted (leaving only the isolated burn sensor layer for the detection of dielectric failure, which needs no longer be isolated by diode CR1) and the biasing circuitry consisting of latch L1 through resistor R3 was not implemented, then the remaining circuit of FIG. 1 would still show the ability to selectively addressably sense a multiplicity of such dielectric failure sensors as may be located upon a plurality of multilayer printed circuit assemblies. Thusly, it may be seen that the preferred embodiment of the present invention as shown in FIG. 1 has certain aspects which are physical and structural, notably the isolated burn sensor layers for the detection of dielectric failure, and additional aspects, notably the duality of sensing dielectric failure and temperature in a time-multiplexed manner plus the selectable addressable sensing of a multiplicity of such conditions as may occur upon a plurality of printed circuit assemblies, which are electrical, and oriented toward the system application of such sensing, in nature. In other words, the preferred embodiment of the present invention as shown in FIG. 1 shows which basically physical fault phenomena to detect —dielectric failure, over temperature and improper connection—and how to electrically detect them and how to efficiently combinatorially detect these faults as may occur upon an array of a multiplicity of printed circuit card assemblies.

Commencing with the detailed electrical explanation of the circuit of the preferred embodiment of the present invention for the detection of the catastrophic failure of the dielectric, the temperature, and the improper connection of a printed circuit assembly, which circuit is shown in FIG. 1, all electrical components shown are standard commercially available parts. Resistors are labeled with their value in ohms, and capacitors with values of one or greater are expressed in picofarads whereas values less than one are in microfarads. The circuitry between the plug jacks connecting to the sensors, such as plug jacks P1 through P16 shown, and the plug jacks connecting to the microprocessor MP, shown as J1 through JN, is called a scan circuit which is normally itself implemented upon a pluggable printed circuit assembly. The current signal from the dielectric failure sensor (during the application of negative bias) and the temperature sensor/transducer S1 (during the application of positive bias) are received at analog multiplexor MUX industry standard part number 506. The connection of one such sensor pair via a single wire is shown through plug jack PN, one of sixteen plug jacks P1 through P16 connecting to analog multiplexor MUX. Each signal line is protected against over voltage transients due to electromagnetic pulse or electrostatic discharge by two reverse biased diodes: illustrated diode CR2 connecting the signal line of plug jack PN to voltage source +15 V and diode CR3 connecting the same signal line to voltage source −15 V, such diodes as are typical of all signal lines. The analog multiplexor MUX is selected to connect one of sixteen possible signal lines, such as that signal line connecting upon plug jack PN, to input pin 2 of buffer amplifier AMP1 under the selection control of signals applied from decoder D1. The selection signals from decoder D1 applied to analog multiplexor MUX, and potentially to further like analog multiplexors as support further groups of sensors, are derived responsively to decode of the address contained within latches L2. Such an address contained within latches L2, interpretable for the selection of an individual sensor pair, is derived from digital address signals sent from microprocessor MP via bidirectional signal lines connecting to plug jacks J1 through JN-1, which signals are used to set various ones of latches L2. The time upon which such address signals from microprocessor MP are lodged in latches L2 is controlled by timing T1, such timing T1 as is not a standard part but which is rather the logical circuit implementation of the communications protocol transpiring on the bidirectional digital communication bus between the scan circuit and microprocessor MP, in accordance with whatsoever digital communications protocol is employed upon this interface. The construction of such a communication bus is routine in the art. Also developed in timing T1 is a gating signal to latch L1 allowing the receipt of a signal from microprocessor MP via the bidirectional communication line through a plug jack JN, and a momentary pulse signal to the analog to digital converter CON at such time as the scan circuit should form a final digitalized output to be sent via the lines connecting through plug jacks J1 through JN to microprocessor MP. For determination of which and when these various enablements should be performed, the timing circuit T1 receives the signals generated at the microprocessor MP which appear upon signal lines connecting through plug jacks J1 through JN-1. In accordance with the interface protocol for the digital communication bus between the scan circuit and the microprocessor MP, the timing T1 may also receive lines such as "data ready to be received" by microprocessor MP, and may issue control signals such as "data ready to be sent" to microprocessor MP. The scan circuit of the present invention as shown in FIG. 1 utilizes a 50 millisecond delay to allow the setting and conversion of the analog signals. In other words, the time upon which timing T1 will cause both the address of the selected sensor pair to become lodged in latches L2, and the selection for sense of one such sensor at said address via the gating of the signal setting (or clearing) latch L1, until such time as the conversion enablement pulse from timing T1 to analog to digital converter CON will become logically false and thus a steady digitalized value will be offered by analog to digital converter CON to microprocessor, MP, will be 50 milliseconds.

Normal employment of the scan circuit and connected sensor pairs by the microprocessor MP will be to continuously cyclically address amongst the multiplicity of connected sensors in order to inspect for the dielectric failure or over temperature fault conditions during the entire operational lifetime during which the connected multilayer printed circuit assemblies are utilized. A large multiplicity of dielectric failure and/or temperature sensors arrayed upon a large plurality of printed circuit assemblies may thus be cyclically interrogated within a cycle period which is suitably short in time (50 milliseconds per sensor) for the adequate protection from catastrophic dielectric failure and over temperature of each of such printed circuit assemblies. The program which runs in microprocessor MP can selectively (rotationally, if desired) interrogate ones of the dielectric failure and temperature sensors (receiving digital results through the scan circuit) and make a determination based on results received as to non-connection (improper connection) or dielectric failure and/or over temperature of a printed circuit assembly. The microprocessor MP will normally be connected to control the power source and coolant source to the printed circuit assemblies (not shown). Normally, a printed circuit assembly will not be powered on unless it can be sensed as properly connected, and would be powered down for the duration of a dielectric failure or over temperature condition (through the control of a program operating in microprocessor MP operating through power control means not shown). Since the circuit of the present invention provides for addressing an abundance of interrogatable sensors, it is normally desirable to create one addressable location to which no sensors are connected, one addressable location connecting to a current source simulating dielectric breakdown, and some number of current sources as simulate the occurrence of various high temperatures. The program operating within microprocessor MP may thusly observe the response of the scan circuit as shown in FIG. 1 to these various simulated fault conditions. A typical systems application of the circuits and methods of the present invention (possessing both sensing and addressing aspects) may thusly be seen to offer a high degree of system verification and safety, the potential existing to validate correct operability within all functional areas. Multiple sensors reflective of separate addresses may be employed for each individual protected printed circuit assembly. The scan circuit itself (normally located as a pluggable printed circuit assembly) may be replicated in duplicate for parallel interconnection to parallel sets of sensors. When such systems level redundancy in the function of the present circuit is combined with the fast time performance of the present circuit, a high degree of confidence in the system physical status as would besuit the protection from fault of very expensive and/or extensive printed circuit assemblies may be obtained.

Continuing in FIG. 1, the scan circuit, so-named because it allows the dielectric failure sensors and/or the temperature sensors to be addressably referenced or scanned, serves as the interface between a multiplicity of such current generating analog sensors and a digital interface to the microprocessor MP. A typical analog current input, connecting via a single wire to both the dielectric failure sensor isolated by diode CR1 type 1N4150 and the temperature sensor/transducer S1 type AD 590J available from Analog Devices, Inc. (which contains a diode) is shown as connector plug jack PN. This signal line, one of sixteen possible into analog multiplexor MUX digital integrated circuit type CMOS 506 is isolated against electromagnetic pulse and electrostatic discharge by diodes CR2 and CR3 which are power diodes type BV-125 V IN458. This addressably selected analog signal line is switchably connected in analog multiplexor MUX to pin 2 of the differential input buffer amplifier AMP1, which is an integrated circuit operational amplifier type TTL 741. The voltage bias at pin 2 of the buffer amplifier AMP1, a positive voltage bias for the sensing of temperature and a negative voltage bias for the sensing of dielectric failure, both voltage biases as are fed through analog multiplexor MUX back to the selected sensors upon the printed circuit assembly, is developed in the bias circuitry proceeding from latch L1 to resistor R3. The latch L1 is a digital integrated circuit flip-flop dual D type TTLS 74LS74, and is set or cleared by the presence or absence of a digital signal from microprocessor MP received through plug jack JN as gated by a signal from timing T1. A voltage bias to the base of transistor Q2, silicon NPN type VCBO 25B 300MW Beta 30, is obtained from resistor R8 type fixed film 0.25 W 2% 10K, diode CR6 type PWR IF 200MA BV-30 V IN914, and resistor R9 type fixed film 0.25 W 2% 10K. When latch L1 is cleared impressing a logical Low, or 0 volt d.c., upon the cathode of diode CR7 type PWR IF 200MA BV IN914 then 0 volts d.c. appears upon the base of transistor Q2 and such transistor is turned off, or non-conducting. In such an eventuality, +15 volts d.c. appears through resistor R6, fixed film type 0.25 W 2% 10K, to the base of transistor Q1 type silicon NPN VCBO 25 V 300MW BETA 30 and makes it non-conducting also. Conversely, if latch L1 is set, the logical High, approximately +3 volt d.c., signal output applied to the cathode of diode CR7 type PWR IF 200MA BV-+V IN914 will enable a voltage to be developed at the base of transistor Q2, turning such transistor on into saturation. Resultantly to the conduction of transistor Q2, the voltage divider composed of resistors R6 and R7, types fixed film 0.25 W 2% 10K, will develop a voltage at the base of transistor Q1 and turn it on into saturation. Transistor Q1 may thusly be turned on or off according to the setting of latch L1.

When transistor Q1 is turned off, the scan circuit operates in the burn sensing mode for the detection of dielectric failure. The voltage divider between −15 volt d.c. and ground GND, consisting of resistances R10 and R11, both types fixed film 0.25 W 2% 4.3K, serves to emplace approximately −7.5 volts d.c. on pin 3 of buffer amplifier AMP1. The operation of buffer amplifier AMP1 will serve, through the feedback loop consisting of diode CR4 type PWR IF 200MA BV- 30 V DN966, and resistor R2 type fixed film 0.25 W 2% 2.2K to force pin 2 to the same voltage as is applied to pin 3, mainly −7.5 volts d.c. There will be no voltage across zener diode CR5, semiconductor device type ZENER 6.20 V nominal 5% 400 MW. The −7.5 volts d.c. voltage appearing at pin 2 of buffer amplifier AMP1 is passed through analog multiplexer MUX type 506 and appears on the cathode on diode CR1. If any leakage occurs in the ISOLATED BURN SENSOR LAYER then such leakage, necessarily to a voltage or ground which is more positive than −7.5 volts d.c. within the printed circuit assembly, will cause pin 2 buffer amplifier AMP1 to go more negative than pin 3. Such a condition will shortly be seen to be impossible for the sensing of temperature, being that such would imply a temperature less than 0° C. which is not encompassable within the calibrated range of the present system (for temperature sensing of printed circuit assemblies immersed in a fluid with a freezing point equal to water, or, in other words, no temperature lower than that of ice is desired to be, or can be, sensed by the present circuit as calibrated in the preferred embodiment). Responsively to the voltage differential between pin 2 and pin 3 of buffer amplifier AMP1 upon the occurrence of a current leakage to the ISOLATED BURN SENSOR LAYER, a voltage will be developed at buffer amplifier AMP1 output pin 6 which, as transmitted through current limiting resistor R13 type fixed film 0.25 W 2% 100K, will be received at pin 3 of the offset differential amplifier AMP2, an integrated circuit operational amplifier type 741. Meanwhile, the −7.5 volt d.c. voltage arising from the resistance divider composed of R10 and R11 is applied through resistor R12 type fixed film 0.25 W 2% 100K to pin 2 of the offset differential amplifier AMP2. The voltage difference is amplified and applied through resistor R16 type fixed film 0.25 W 2% 15 ohms to analog to digital converter CON. This voltage is digitalized in analog to digital converter CON, integrated circuit type AD570, during the true occurrence of a conversion time pulse received from timing T1 and emplaced on parallel digital signal lines for receipt, through plug jacks J1 through JN, by microprocessor MP. If the microprocessor MP had directed and selected a sensing of a dielectric failure sensor, than any non-zero digitalized voltage level received on these parallel signal lines represents a dielectric breakdown and potential burn of the selected printed circuit assembly.

When the scan circuit is employed in the temperature sensing mode, latch L1 will be set, producing a logical High voltage output signal and resulting the ultimate saturated conduction of transistors Q1 and Q2. When transistor Q1 is conducting in saturation, the voltage drop across this transistor has no effect upon the accuracy of the circuit, the voltage drop being seen across pins 2 and 3 of buffer amplifier AMP1 being solely a function of the voltage drop across zener diode CR5 and resistors R3, R4, and R5. This voltage drop will be nominally +6.20 volts d.c. The voltage drop across zener diode CR5 and resistances R3, R4 and R5 gives the constant offset voltage which is required to convert degrees Kelvin to degrees Centigrade, or in other words, a +273 degrees Kelvin offset. When such an offset is applied, then 0 volts d.c. appearing between pins 2 and 3 of buffer amplifier AMP1 will correspond to 0° C. as sensed by temperature sensors/transducers S1. Fixed resistor R3, fixed film type 0.25 W 2% 18K ohms, and fine adjustment variable resistance R4, type 0.5 watts 5% 500 ohms wirewound, and course variable resistance R5, type 0.5 watts 5% 10K ohms wirewound, are adjusted during calibration so that this desired +273 degree Kelvin offset maybe obtained. The diode CR4, which conducted when the voltage on pin 6 of buffer amplifier AMP1 was negative relative to the voltage on pin 2 during the monitoring of dielectric failure, now isolates resistor R2 during the sensing of temperature. Instead, resistor R1, a precision fixed film resistor type 0.25 W 1% 50K, converts the current of temperature sensor/transducer S1 to voltage across pins 2 and 3 of buffer amplifier AMP1. This resistor R1 converts the current of temperature sensor/transducer S1 to voltage at 50 millivolts per 1° C., and is critical for accuracy. Capacitor C1, fixed tantalum dielectric type 50 V 20% 0.01 microfarads is for noise suppression. The voltage developed at pin 6 of buffer amplifier AMP1, equal in value to 50 millivolts per degree Centigrade above 0.20 C. as sensed by temperature sensors/transducers S1, is passed through resistor R13 to pin 5 of the offset differential amplifier AMP2. The voltage reference arising from the voltage divider comprised of resistors R10 and R11 is similarly passed through resistance R12 to pin 2 of the offset differential amplifier AMP2. Parallel capacitor C2 type fixed ceramic dielectric 50 V 20% 0.01 microfarads and resistor R14 type fixed film 0.25 W 2% 100K serve as a filter. A feedback loop from pin 6 to pin 2 of offset differential amplifier AMP2 is established through parallel capacitor C3, type fixed ceramic dielectric 50 V 20% 0.01 microfarads and resistor R15, type fixed film 0.25 W 2% 100K. The capacitor C4, type fixed ceramic dielectric 35 V 20% 0.01 microfarads is for noise suppression. The voltage responsive to temperature sensing, offset to give 0 volt d.c. equal 0° C., and amplified at 50 millivolts per degree Centigrade above this base, is passed through resistor R16 and digitalized in analog to digital converter CON for issuance to microprocessor MP. The timing, as conducted in timing T1, of the receipt of all commands from microprocessor MP, and the subsequent issuance, across bidirectional data bus lines, of the digitalized results of the directed sensing is primarily a function of the timed protocol of the digital interface. In other words, the sequence of control effectuated in timing T1 will be a function of the digital interface chosen, the construction of which is routine to a practitioner in the arts. A sole consideration invoked by the present scan circuit is that address selection as accomplished in latches L2 and decoded in decoder D1, as well as the selection of the dielectric failure or the temperature sensor as is accomplished in latch L1, would normally be stabilized 50 milliseconds before the timing T1 would stop the conversion pulse to the analog to digital converter CON for digitalization of the selected (analog) signal. At this time the final digital conversion value is held in analog to digital converter CON. This digitalized value is accessible by microprocessor MP as the output of analog to digital converter CON, integrated circuit type AD570J, at any subsequent time to this final conversion.

A suggested systems utilization of the sensors for detection of the catastrophic failure of the dielectric, the improper connection and/or the over temperature of a printed circuit card assembly via one wire by the scan circuit of the present invention is as follows. The microprocessor control would, normally, send in cyclic rotation the addresses, and receive the data, for interrogation of the temperature sensor/transducers S1 upon a multiplicity of printed circuit assemblies. If a no response, indicating 0 volts corresponding to 0° C. or 5 volts representing 100° C., was received for some assembly or assemblies, it would be particularly useful if a second temperature sensor/transducer S1 were available for interrogation upon the same physical printed circuit assembly. If neither of two temperature sensor/transducers S1, as well as the isolated burn sensor layer, can be sensed as giving anything but a wrong response upon a single printed circuit assembly, then the logical conclusion is that such a printed circuit assembly is not correctly pluggably connected. As well as the rotational, scanned, interrogation of the multiplicity of temperature sensor/transducer S1 as reside on a plurality of printed circuit assemblies, some temperature sensor/transducers S1 which are located within the coolant stream (either liquid or air) may also be interrogated. The microprocessor MP would normally compare the results from temperature interrogations occurring at all locations with a priorly developed system temperature profile table to the end of alterting the system operator, and possibly automatically removing power, in the event of various levels of over temperature conditions within various system locations. As a validation of the correct function of the scan circuitry, four addresses providing fixed current into analog multiplexor MUX may be sensed during each cycle of checking the multiplicity of sensors upon the plurality of printed circuit assemblies. Each of these four addresses would produce a current indicative of a simulated fault: a short between ground and the isolated burn sensor layer (or ground), an open connection to the scan circuit, a first high temperature and a second over temperature. The microprocessor MP might simply observe these correct responses to simulated fault conditions, or might even develop appropriate control signals which could be analyzed at a further systems level, such as power control, in validation of even the correct operation of the microprocessor MP in the systems detection and response to dielectric failure and temperature faults. A microprocessor MP will normally rotate the dielectric sensor and temperature sensor checks as performed upon a multiplicity of printed circuit assemblies in a cyclical continuous manner for the entire time during which power is applied. If the microprocessor MP ever fails to receive any sensor data from the scan circuitry whatsoever, then such scan circuitry may be deemed to have failed and printed circuit assemblies scanned by this circuitry plus the scan circuit would be normally powered off (power control not shown) for repair. It would normally be monitored and detected by microprocessor MP that the scan circuit had failed to respond in time, nominally 100 milliseconds. If any individual printed circuit assembly under test is ever detected to exhibit a dielectric failure or an over temperature condition, the microprocessor MP would normally cause system power control (not shown) to turn off such printed circuit assembly to prevent further potential damage. It should be noted that such a microprocessor MP based scan of system status might be adversely affected if the system were partially carded; that is, certain printed circuit assemblies were withdrawn. A simple solution would be to employ dummy cards having fixed resistors on them in place of the temperature sensor/transducer S1. The intent of the scenario just described is to show that the method and the apparatus of the present invention are readily adaptable to timely, continuous, flexible, reliable, and visible-of-failure observations of the dielectric integrity and temperature status of a large multiplicity of printed circuit assemblies. By the nature of the temperature readout method employed, a short or an open is not an acceptable level and therefore the protection accorded by the present invention cannot be defeated easily.

While a specific preferred embodiment of the invention has been described in detail as two sensors, a time-multiplexing voltage biasing and sensing circuit allowing the joint interrogation of both via a single wire, and a selection circuit allowing the rotational interrogation of a multiplicity of such sensor pairs, it will be understood that the basic principles of the invention may be utilized in alternative manner. Furthermore, although the invention has been particularly shown and described with reference to the preferred embodiment thereof, it will be understood by those skilled in the art that various alterations in form and detail may be made therein without departing from the spirit and scope of the invention. For example, the microprocessor interface and the resultant capability to address amongst a multiplicity of sensor pairs may be eliminated and the present circuit is reducible to simply the time-multiplexed analog interrogation of a sensor pair. For example, the dielectric failure sensors may be eliminated and a multiplicity of temperature sensor/transducers may be selectively addressably interrogated when such temperature sensor/transducers are not located upon a multilayer printed circuit assembly. For example, the temperature sensor/transducers may be eliminated and a multiplicity of dielectric failure sensors located upon a plurality of multilayer printed circuit assemblies may be selectively addressably interrogated. For example, each sensor could be interfaced via a separate wire separately biased to the analog multiplexor MUX as an individual address, and subsequently converted from current to voltage, amplified, and encoded (although such division would sacrifice the desirable economy of utilizing a single wire to two sensors). For example, the circuit of the present invention could be employed with substitutionary, alternative, sensors giving a current output responsively to conditions such as pressure. For example the circuit of the present invention could be employed with a temperature sensor in an alternative range and with an alternative calibration.

The embodiments of the invention in which an exclusive property or privilege is claimed are defined as follows:

1. A multilayer printed circuit board comprising:
   a plurality of electrically conductive layers, and
   a plurality of electrically insulating layers, wherein
      one of said plurality of electrically conductive layers is an electrically isolated conductive layer normally of high resistance to all other voltages, signals, and grounds as exist upon other ones of said plurality of electrically conductive layers of said multilayer printed circuit board, but which said one electrically isolated conductive layer assumes a lower resistance to one or ones of said other voltages, signals and grounds if the electrically insulating dielectric of said multilayer printed circuit board is subject to carbonization by burning;
   wherein said one electrically isolated conductive layer is suitable as a sensor to detect the failure of the electrically insulating dielectric of said printed circuit board.

2. The multilayer printed circuit board of claim 1 wherein said one electrically isolated conductive layer further comprises:
   an electrically isolated conductive layer of copper normally of high resistance to all other voltages, signals, and grounds as exist upon other ones of said plurality of electrically conductive layers also of copper of said multilayer printed circuit board.

3. The multilayer printed circuit board of claim 1 wherein said one electrically isolated conductive layer further comprises:
   an electrically isolated conductive layer which is both
      (1) normally of high resistance to all other voltages, signals, and grounds as exist upon other ones of said plurality of electrically conductive layers of said multilayer printed circuit board while simultaneously being
      (2) electrically biased during operational usage of said multilayer printed circuit board with a bias voltage of greater voltage magnitude than any other said voltages, signals, and grounds as are transmitted upon other ones of said plurality of electrically conductive layers of said multilayer printed circuit board during said operational usage of said multilayer printed circuit board.

4. The multilayer printed circuit board of claim 1 wherein said one electrically isolated conductive layer further comprises:
   an electrically isolated conductive layer which is simultaneously
      (1) normally of high resistance to all other voltages, signals, and grounds as exist upon other ones of said plurality of electrically conductive layers of said multilayer printed circuit board, and
      (2) electrically biased during operational usage of said multilayer printed circuit board with a bias voltage of greater voltage magnitude than any other said voltages, signals, or grounds as are transmitted upon other ones of said plurality of electrically conductive layers of said multilayer printed circuit board during said operational usage of said multilayer printed circuit board; and
      (3) said electrically biased being further through a diode with said bias voltage which said bias voltage is of correct polarity to forward bias said diode as well as being of said greater voltage magnitude than said any other said voltages, signals, or grounds as are transmitted upon other ones of said plurality of electrically conductive layers of said multilayer printed circuit board.

5. The multilayer printed circuit board of claim 1 wherein said one electrically isolated conductive layer further comprises:
   an electrically isolated conductive layer which is simultaneously upon a first time
      (1) normally of high resistance to all other voltages, signals, and grounds as exist upon other ones of said plurality of electrically conductive layers of said multilayer printed circuit board, and
      (2) electrically biased during first time operational usage of said multilayer printed circuit board with a first bias voltage of greater voltage magnitude than any other said voltages, signals, or grounds as are transmitted upon other ones of said plurality of electrically conductive layers of said multilayer printed circuit board during said operational usage of said multilayer printed circuit board; and
      (3) said electrically biased being further through a diode with said first bias voltage, which said first bias voltage is of correct polarity to forward bias said diode as well as being of said greater voltage magnitude than said any other voltages, signals, or grounds as are transmitted upon other ones of said plurality of electrically conductive layers of said multilayer printed circuit board,
   and which is simultaneously upon a second time
      (1) normally of high resistance to all other voltages, signals, and grounds as exist upon other ones of said plurality of electrically conductive layers of said multilayer printed circuit board, and
      (2) electrically biased during second time operational usage of said multilayer printed circuit board with a second bias voltage of greater voltage magnitude than any other said voltages, signals, or grounds as are transmitted upon other ones of said plurality of electrically conductive layers of said multilayer printed circuit board during said operational usage of said multilayer printed circuit board; and
      (3) said electrically biased being further through a diode with said second bias voltage, which said second bias voltage is of correct polarity to reverse bias said diode as well as being of said greater voltage magnitude than said any other said voltages, signals, or grounds as are transmitted upon other ones of said plurality of electrically conductive layers of said multilayer printed circuit board.

* * * * *